United States Patent
Suenaga et al.

(10) Patent No.: US 11,678,472 B2
(45) Date of Patent: Jun. 13, 2023

(54) SIGNAL TRANSMISSION CABLE

(71) Applicant: PROTERIAL, LTD., Tokyo (JP)

(72) Inventors: Kazufumi Suenaga, Tokyo (JP); Takahiro Sugiyama, Tokyo (JP); Hideyuki Sagawa, Tokyo (JP)

(73) Assignee: Proterial, Ltd., Tokyo (JP)

( * ) Notice: Subject to any disclaimer, the term of this patent is extended or adjusted under 35 U.S.C. 154(b) by 0 days.

(21) Appl. No.: 16/222,980

(22) Filed: Dec. 17, 2018

(65) Prior Publication Data

US 2019/0191601 A1    Jun. 20, 2019

(30) Foreign Application Priority Data

Dec. 18, 2017   (JP) .............................. JP2017-241998

(51) Int. Cl.
    *H05K 9/00*          (2006.01)
    *H01B 3/44*          (2006.01)
    (Continued)

(52) U.S. Cl.
    CPC ........... *H05K 9/0098* (2013.01); *H01B 3/445* (2013.01); *H01B 11/002* (2013.01);
    (Continued)

(58) Field of Classification Search
    CPC ....................... H01B 11/1834; H01B 13/0036; H01B 13/22; H01B 13/222; H05K 9/088; H05K 9/0098
    See application file for complete search history.

(56) References Cited

U.S. PATENT DOCUMENTS 3,100,136 A * 8/1963 D Ascoli .............. H01B 13/065
                                                     264/105
3,259,688 A * 7/1966 Towne .................. H01B 9/027
                                                     174/107
(Continued)

FOREIGN PATENT DOCUMENTS

JP        2002084089 A     3/2002
JP        2002280208 A     9/2002
(Continued)

OTHER PUBLICATIONS

Examination Report dated Feb. 1, 2021 in Chinese Patent Application No. 201811535178.2 and English translation.
(Continued)

*Primary Examiner* — Timothy J Thompson
*Assistant Examiner* — Rhadames Alonzo Miller
(74) *Attorney, Agent, or Firm* — Meunier Carlin & Curfman LLC

(57) ABSTRACT

A signal transmission cable includes a signal line, an insulation layer covering the signal line, and a shield layer covering the insulation layer. A first oxygen amount $A_1$ on an outer peripheral surface of the insulation layer is 1.2 times or greater than a second oxygen amount $A_2$ inside the insulation layer, or a contact angle on the outer peripheral surface the insulation layer is 130° or less, or an adhesion-wetting surface energy on the outer peripheral surface the insulation layer is 27 mJ/m² or greater, or a first amount of a hydroxy group on the outer peripheral surface of the insulation layer is greater than a second amount of a hydroxy group inside the insulation layer.

13 Claims, 9 Drawing Sheets

(51) Int. Cl.
*H01B 13/00* (2006.01)
*H01B 11/00* (2006.01)
*H01B 13/26* (2006.01)
*H01B 13/22* (2006.01)
*H01B 11/20* (2006.01)
*H01B 11/18* (2006.01)

(52) U.S. Cl.
CPC ....... H01B 13/0036 (2013.01); H05K 9/0088 (2013.01); *H01B 11/1834* (2013.01); *H01B 11/203* (2013.01); *H01B 13/22* (2013.01); *H01B 13/222* (2013.01); *H01B 13/26* (2013.01)

(56) References Cited

U.S. PATENT DOCUMENTS

| | | | | |
|---|---|---|---|---|
| 3,397,046 | A | * 8/1968 | Greyson | H01B 7/2806 |
| | | | | 428/623 |
| 5,128,175 | A | * 7/1992 | Yamanishi | H01B 7/0233 |
| | | | | 427/515 |
| 5,192,834 | A | * 3/1993 | Yamanishi | H01B 7/0233 |
| | | | | 174/110 F |
| 2003/0150633 | A1 | 8/2003 | Hirakawa | |
| 2004/0026101 | A1 | 2/2004 | Ochi | |
| 2016/0099090 | A1* | 4/2016 | Huang | H01B 1/026 |
| | | | | 174/102 A |
| 2017/0178764 | A1* | 6/2017 | Huang | H01R 4/183 |
| 2019/0013559 | A1 | 1/2019 | Suenaga et al. | |

FOREIGN PATENT DOCUMENTS

| | | | | |
|---|---|---|---|---|
| JP | 2002289047 | A | | 10/2002 |
| JP | 2003234025 | A | | 8/2003 |
| JP | 2003272455 | A | * | 9/2003 |
| JP | 2003272455 | A | | 9/2003 |
| JP | 2005149892 | A | * | 6/2005 |
| JP | 2005149892 | A | | 6/2005 |
| JP | 2007221005 | A | | 8/2007 |
| JP | 2012204734 | A | * | 10/2012 |
| JP | 2012204734 | A | | 10/2012 |
| JP | 2016024953 | A | | 2/2016 |
| JP | 2016127429 | A | | 7/2016 |
| JP | 6245402 | B1 | | 12/2017 |
| JP | 2019016451 | A | * | 1/2019 ........... H01B 13/222 |

OTHER PUBLICATIONS

Notice of Reasons for Rejection dated Apr. 6, 2021 in Japanese patent application No. 2017-241998 and its machine-generated English translation.

Second Office Action in connection to Chinese Application No. 201811535174.2, dated Jul. 20, 2021.

Office action dated Dec. 27, 2021 in the corresponding Chinese patent application No. 201811535174.2 and its full English translation.

Office action dated May 30, 2022 in the corresponding Chinese patent application No. 201811535174.2 and its full English translation.

Reexamination Notice dated Dec. 2, 2022, in Chinese Patent Application No. 201811535174.2.

* cited by examiner

SIGNAL TRANSMISSION CABLE

CROSS-REFERENCE TO RELATED APPLICATIONS

This application claims the benefit of Japanese Patent Application No. 2017-241998 filed on Dec. 18, 2017 with the Japan Patent Office, the entire disclosure of which is incorporated herein by reference.

BACKGROUND

The present disclosure relates to a signal transmission cable.

Conventionally, signal transmission cables are used for signal transmission between electronic devices, or signal transmission between boards in an electronic device. Such a signal transmission cable includes a signal line, an insulation layer covering the signal line, and a shield layer covering the insulation layer, for example, as disclosed in Japanese Unexamined Patent Application Publication No. 2002-289047 and Japanese Unexamined Patent Application Publication No. 2003-234025. The shield layer is configured, for example, with a metal tape, a metal braid, or the like, wound around an outer periphery of the insulation layer.

SUMMARY

In some conventional signal transmission cables, adhesion between the insulation layer and the shield layer is insufficient. Insufficient adhesion between the insulation layer and the shield layer may result in a gap between the insulation layer and the shield layer. Such a gap between the insulation layer and the shield layer may result in an insufficient shielding effect by the shield layer.

One aspect of the present disclosure provides a signal transmission cable that comprises a signal line, an insulation layer covering the signal line, and a shield layer covering the insulation layer. A first oxygen amount $A_1$ on an outer peripheral surface of the insulation layer is 1.2 times or greater than a second oxygen amount $A_2$ inside the insulation layer. In the signal transmission cable in this aspect of the present disclosure, a high adhesion between the insulation layer and the shield layer is achieved.

In the signal transmission cable, a contact angle on the outer peripheral surface of the insulation layer may be 130° or less.

In the signal transmission cable, an adhesion-wetting surface energy on the outer peripheral surface of the insulation layer may be 27 mJ/m$^2$ or greater.

In the signal transmission cable, a first amount of a hydroxy group on the outer peripheral surface of the insulation layer may be greater than a second amount of a hydroxy group inside the insulation layer.

BRIEF DESCRIPTION OF THE DRAWINGS

Hereinafter, an example embodiment of the present disclosure will be described with reference to the accompanying drawings, in which.

DETAILED DESCRIPTION OF THE PREFERRED EMBODIMENTS

1. Signal Transmission Cable

(1-1) Basic Configuration of Signal Transmission Cable

A signal transmission cable of the present disclosure comprises a signal line, an insulation layer covering the signal line, and a shield layer covering the insulation layer. The signal transmission cable of the present disclosure may be, for example, a differential signal transmission cable, or may be another type of signal transmission cable. The differential signal transmission cable comprises two signal lines.

In a case where the signal transmission cable of the present disclosure is a differential signal transmission cable, signal transmission to a recipient by a differential signal can be performed. In signal transmission by a differential signal, mutually opposite phase signals are inputted to the two signal lines. The recipient synthesizes a difference between the mutually opposite phase signals to obtain an output.

Figure 1:
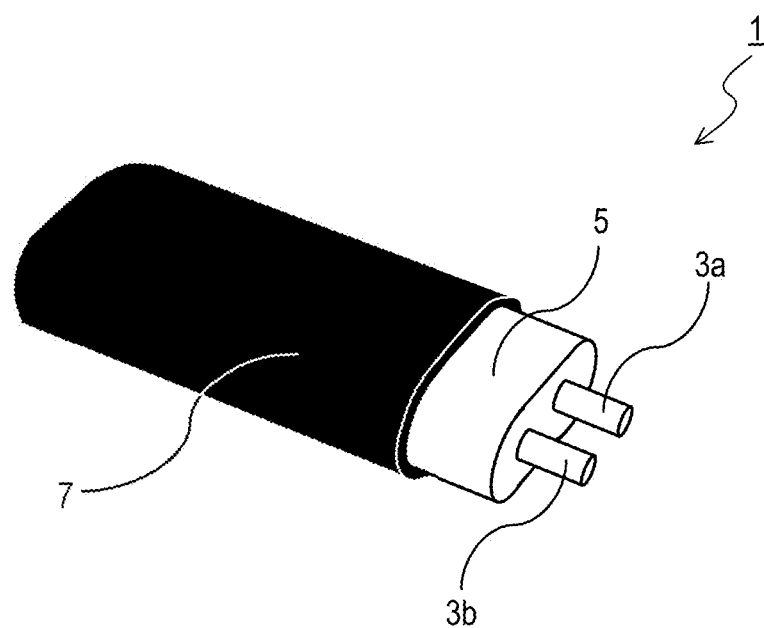
FIG. 1 is a perspective view showing a configuration of a signal transmission cable 1.

The signal transmission cable of the present disclosure, for example, has a configuration shown in FIG. 1. This example of the signal transmission cable is a differential signal transmission cable. FIG. 1 shows a signal transmission cable 1 that comprises a first and a second signal lines 3a, 3b, an insulation layer 5, and a shield layer 7. The insulation layer 5 covers the first and second signal lines 3a, 3b. In the example shown in FIG. 1, the insulation layer 5 collectively covers the first and second signal lines 3a, 3b. The first and second signal lines 3a, 3b each comprise, for example, strands. The first and second signal lines 3a, 3b each may be, for example, a twisted wire formed of a plurality of twisted strands. In the twisted wire, the first and second signal lines 3a, 3b each have an improved flexibility.

The signal transmission cable of the present disclosure may be used, for example, signal transmission between electronic devices, or signal transmission between boards in an electronic device. Examples of the electronic devices may include a server, a router, and a storage product that handle high speed signals of several Gbps or higher. Also, the signal transmission cable of the present disclosure may be used, for example, for an acoustic cable. The signal transmission cable of the present disclosure is, for example, a cable for transmitting a high speed signal of 25 GHz or higher.

(1-2) Insulation Layer

An oxygen amount on an outer peripheral surface of the insulation layer is referred to as a first oxygen amount $A_1$. An oxygen amount inside the insulation layer is referred to as a second oxygen amount $A_2$. A ratio of the first oxygen amount $A_1$ to the second oxygen amount $A_2$ is hereinafter referred to as an $A_1/A_2$ ratio. In the signal transmission cable of the present disclosure, the $A_1/A_2$ ratio is preferably 1.2 or greater. When the $A_1/A_2$ ratio is 1.2 or greater, an increased adhesion between the insulation layer and the shield layer is achieved. Particularly when the shield layer is a plating layer, adhesion between the insulation layer and the shield layer is increased, resulting in high uniformity of the shield layer.

Figure 2:
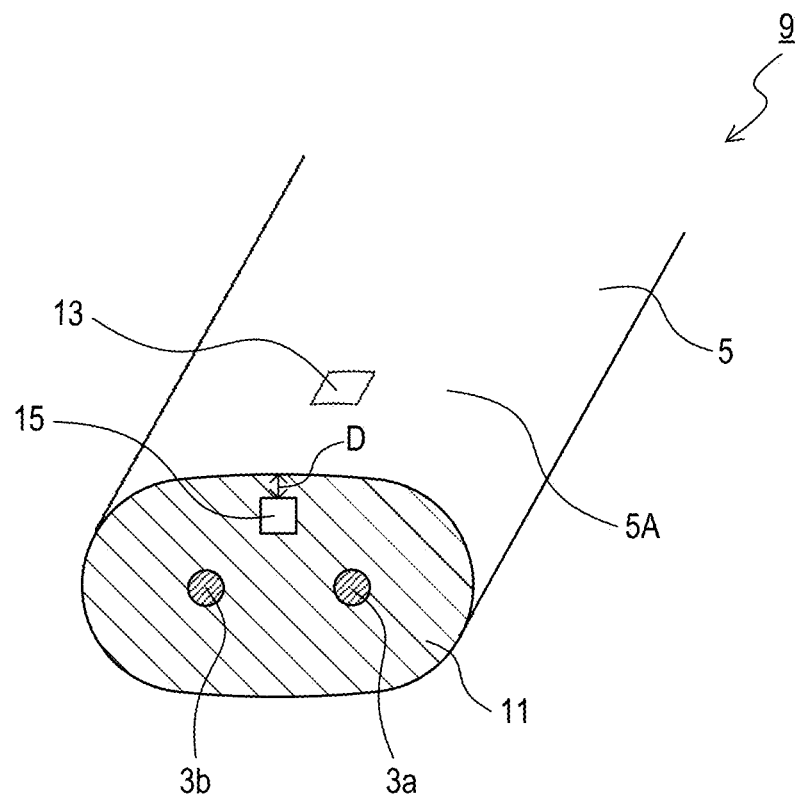
FIG. 2 is an explanatory view showing a method for measuring a first oxygen amount $A_1$ and a second oxygen amount $A_2$.

A measurement method of the first oxygen amount $A_1$ and the second oxygen amount $A_2$ is as described below. As shown in FIG. 2, a sample 9 that comprises the first and second signal lines 3a, 3b and the insulation layer 5 is prepared. The sample 9 does not have a shield layer. The sample 9 may be prepared by removing the shield layer 7 from the signal transmission cable 1, or may be a cable before forming a shield layer. Subsequently, the sample 9 is cut to provide a section 11 of the insulation layer 5. The section 11 is a section orthogonal to a longitudinal direction of the signal transmission cable 1.

A first measurement region 13 is specified on an outer peripheral surface 5A, other than the section 11, of the insulation layer 5. The first measurement region 13 is a square region with a size of 100 μm×100 μm. A second measurement region 15 is specified on the section 11. The second measurement region 15 has the same shape and size as those of the first measurement region 13. A distance D between the second measurement region 15 and the outer peripheral surface 5A is 10 μm. The second measurement region 15 corresponds to an inside of the insulation layer.

An electron beam is radiated to the first measurement region 13 using SEM-EDX to detect a characteristic X-ray. An acceleration voltage of the electron beam is 10 keV. An area of a peak of the X-ray appearing in a wavelength corresponding to oxygen is calculated, and the calculated peak area is defined as the first oxygen amount $A_1$. Similarly, in the second measurement region 15, an area of a peak of the X-ray appearing in a wavelength corresponding to oxygen is calculated, and the calculated peak area is defined as the second oxygen amount $A_2$.

A method for increasing the $A_1/A_2$ ratio may include performing a surface modification treatment of the insulation layer 5. The surface modification treatment may be performed, for example, after covering the first and second signal lines 3a, 3b with the insulation layer 5 and before forming the shield layer 7.

The surface modification treatment for increasing the $A_1/A_2$ ratio may include, for example, wet treatment and dry treatment. The wet treatment may include, for example, a treatment of immersion in a highly oxidative chemical liquid.

Specific examples of the surface modification treatment for increasing the $A_1/A_2$ ratio may include electron beam irradiation, ion irradiation, corona discharge exposure, plasma exposure, ultraviolet irradiation, X-ray irradiation, γ-ray irradiation, immersion in ozone-containing liquid, immersion in acidic or alkaline solution, immersion in permanganic acid solution, immersion in chelate solution, sandblasting, wet blasting, and dry ice blasting. Two or more of these treatments may be performed.

The permanganic acid solution used in the immersion in permanganic acid solution may have a concentration of, for example, 500 ml/L or greater. The permanganic acid solution used in the immersion in permanganic acid solution may have a temperature of, for example, 90° C. The temperature of the permanganic acid solution may be maintained at 90° C., for example, by combustion heating or heater heating.

While performing immersion in permanganic acid solution, for example, a treatment target may be shaken in the solution. In this case, a surface of the treatment target can be modified uniformly. An immersing time in the immersion in permanganic acid solution may be, for example, 1 to 60 minutes.

The permanganic acid solution may be stored, for example, in a quartz glass or stainless container. Subsequent to the immersion in permanganic acid solution, the treatment target is preferably immersed and shaken in water to be washed. This reduces influence of the permanganic acid solution in subsequent steps.

A system to be used for dry ice blasting may be, for example, "SUPERBLAST DSC-V Reborn" or "SUPERBLAST DSC-I", which is a dry ice cleaning system produced by KYODO INTERNATIONAL INC. Preferable treatment conditions of dry ice blasting are as follows:

Air pressure: 0.1 to 1.0 MPa

Particle size ϕ of dry ice particles: 0.3 to 3 mm

Distance between a surface to be modified and a tip of a nozzle for blasting dry ice particles: 0 to 10 cm Temperature at the surface to be modified and the entire treatment target during dry ice blasting: −80° C. to room temperature An apparatus to be used for corona discharge or plasma discharge may be, for example, a corona discharge surface modification apparatus (Corona Master PS-1M) produced by Shinko Electric & Instrumentation Co., Ltd. Corona discharge or plasma discharge may be performed, for example, as described below. Placing a treatment target on an earth electrode. Applying a high voltage to a discharge probe. Positioning the discharge probe to contact the treatment target or to be apart from the treatment target by approximately several millimeters. Under such conditions, scanning the discharge probe over the treatment target at a speed of 0.15 to 15 mm/sec. The number of scans and an exposure time may be adjusted appropriately.

In the surface modification treatment for increasing the $A_1/A_2$ ratio, for example, a first treatment may be performed and then a second treatment may be performed. The first treatment may be performed by, for example, sand blasting, wet blasting, dry ice blasting, immersion in acidic or alkaline solution, immersion in permanganic acid solution, or immersion in chelate solution. Two or more of these treatments may be performed as the first treatment.

The second treatment may be performed by, for example, electron beam irradiation, ion irradiation, corona discharge exposure, plasma exposure, ultraviolet irradiation, X-ray irradiation, γ-ray irradiation, and immersion in ozone-containing liquid.

In the surface modification treatment for increasing the $A_1/A_2$ ratio, for example, dry ice blasting may be first performed, and then corona discharge exposure or plasma exposure may be performed. In the surface modification treatment for increasing the $A_1/A_2$ ratio, for example, dry ice blasting may be first performed, and then immersion in permanganic acid solution may be performed. In the surface modification treatment for increasing the $A_1/A_2$ ratio, for example, corona discharge exposure or plasma exposure may be first performed, and then immersion in permanganic acid solution may be performed. In the surface modification treatment for increasing the $A_1/A_2$ ratio, for example, dry ice blasting may be first performed at a temperature of −79° C. or less, and then corona discharge exposure or plasma exposure may be performed at a temperature of −79° C. or greater. In the surface modification treatment for increasing the $A_1/A_2$ ratio, for example, dry ice blasting may be first performed at a temperature of −79° C. or less, and then immersion in permanganic acid solution may be performed at ordinary temperature or higher temperature.

As an intensity of the surface modification treatment is increased, the $A_1/A_2$ ratio is increased. For example, in the case of immersion in permanganic acid solution, the $A_1/A_2$ ratio is increased as the concentration of the permanganic acid solution is increased. As the immersing time in the permanganic acid solution is increased, the $A_1/A_2$ ratio is increased. As the temperature of the permanganic acid solution is increased, the $A_1/A_2$ ratio is increased. When no surface modification treatment is performed, the $A_1/A_2$ ratio is, for example, approximately one. The second oxygen amount $A_2$ hardly changes between before and after the surface modification treatment.

In the signal transmission cable of the present disclosure, a contact angle on the outer peripheral surface of the insulation layer is preferably 130° or less. When the contact angle is 130° or less, high adhesion between the insulation layer and the shield layer can be achieved. Particularly when the shield layer is a plating layer, adhesion between the insulation layer and the shield layer is increased, resulting in high uniformity of the shield layer.

A method for reducing the contact angle on the outer peripheral surface of the insulation layer may include performing a surface modification treatment to the insulation layer 5. The surface modification treatment may be performed, for example, after covering the signal line 3 with the insulation layer 5 and before forming the shield layer 7. The surface modification treatment for increasing the $A_1/A_2$ ratio as described above may be used for the surface modification treatment to reduce the contact angle on the outer peripheral surface of the insulation layer.

As an intensity of the surface modification treatment is increased, the contact angle on the outer peripheral surface of the insulation layer is reduced. For example, in the case of immersion in permanganic acid solution, the contact angle on the outer peripheral surface of the insulation layer is reduced as the concentration of the permanganic acid solution is increased. As the immersing time in the permanganic acid solution is increased, the contact angle on the outer peripheral surface of the insulation layer is reduced. As the temperature of the permanganic acid solution is increased, the contact angle on the outer peripheral surface of the insulation layer is reduced.

In the signal transmission cable of the present disclosure, an adhesion-wetting surface energy on the outer peripheral surface of insulation layer is preferably 27 mJ/m² or greater.

An absolute value of the adhesion-wetting surface energy ΔG is calculated according to a formula (1) below.

$$|\Delta G|=|-\gamma_{LG}(\cos\theta+1)|$$ [Formula 1]

In Formula (1), $\gamma_{LG}$ is a constant having a value of 72.75 mJ/m²; θ is a contact angle on the outer peripheral surface of the insulation layer; and the adhesion-wetting surface energy ΔG is a value before forming the shield layer.

When the adhesion-wetting surface energy is 27 mJ/m² or greater, then the adhesion between the insulation layer and the shield layer is increased. Particularly when the shield layer is a plating layer, adhesion between the insulation layer and the shield layer is increased, resulting in high uniformity of the shield layer.

A method for increasing the adhesion-wetting surface energy on the outer peripheral surface of the insulation layer may include performing a surface modification treatment to the insulation layer 5. The surface modification treatment may be performed, for example, after covering the signal line 3 with the insulation layer 5 and before forming the shield layer 7. The surface modification treatment for increasing the $A_1/A_2$ ratio as described above may be used for the surface modification treatment to increase the adhesion-wetting surface energy on the outer peripheral surface of the insulation layer.

As an intensity of the surface modification treatment is increased, the adhesion-wetting surface energy on the outer peripheral surface of the insulation layer is increased. For example, in the case of immersion in permanganic acid solution, the adhesion-wetting surface energy on the outer peripheral surface of the insulation layer is increased as the concentration of the permanganic acid solution is increased. As the immersing time in the permanganic acid solution is increased, the adhesion-wetting surface energy on the outer peripheral surface of the insulation layer is increased. As the temperature of the permanganic acid solution is increased, the adhesion-wetting surface energy on the outer peripheral surface of the insulation layer is increased.

In the signal transmission cable of the present disclosure, a first amount of a hydroxy group on the outer peripheral surface of the insulation layer is preferably greater than a second amount of a hydroxy group inside the insulation layer. When the first amount of the hydroxy group on the outer peripheral surface of the insulation layer is greater than the second amount of the hydroxy group inside the insulation layer, adhesion between the insulation layer and the shield layer is increased. Particularly when the shield layer is a plating layer, adhesion between the insulation layer and the shield layer is increased, resulting in high uniformity of the shield layer.

A method for measuring the first amount of the hydroxy group on the outer peripheral surface of the insulation layer, and the second amount of the hydroxy group inside the insulation layer is as follows: Preparing the sample 9 shown in FIG. 2, similarly to measuring the first oxygen amount $A_1$ and the second oxygen amount $A_2$. Measuring an infrared absorption spectrum in the first measurement region 13 using FT-IR. Identifying a peak corresponding to the hydroxy group in the infrared absorption spectrum, and defining a peak area thereof as the first amount of the hydroxy group on the outer peripheral surface of the insulation layer. Similarly, identifying a peak corresponding to the hydroxy group in the second measurement region 15, and defining a peak area thereof as the second amount of the hydroxy group inside the insulation layer.

A method for increasing the first amount of the hydroxy group on the outer peripheral surface of the insulation layer may include performing a surface modification treatment to the insulation layer 5. The surface modification treatment may be performed, for example, after covering the signal line 3 with the insulation layer 5 and before forming the shield layer 7. The surface modification treatment for increasing the $A_1/A_2$ ratio as described above may be used for the surface modification treatment to increase the first amount of the hydroxy group on the outer peripheral surface of the insulation layer.

As an intensity of the surface modification treatment is increased, the first amount of the hydroxy group on the outer peripheral surface of the insulation layer is increased. For example, in the case of immersion in permanganic acid solution, the first amount of the hydroxy group on the outer peripheral surface of the insulation layer is increased as the concentration of the permanganic acid solution is increased. As the immersing time in the permanganic acid solution is increased, the first amount of the hydroxy group on the outer peripheral surface of the insulation layer is increased. As the temperature of the permanganic acid solution is increased, the first amount of the hydroxy group on the outer peripheral surface of the insulation layer is increased. When no surface modification treatment is performed, for example, the first amount of the hydroxy group on the outer peripheral surface of the insulation layer is approximately equal to the second amount of the hydroxy group inside the insulation layer. The second amount of the hydroxy group inside the insulation layer hardly changes due to the surface modification treatment.

In the signal transmission cable of the present disclosure, an arithmetic average roughness Ra of the outer peripheral surface of the insulation layer is preferably 0.1 μm or greater. In this case, adhesion between the shield layer and the insulation layer is increased, and the shield layer is less likely to come off the insulation layer. When the arithmetic average roughness Ra is 0.16 μm or greater, adhesion between the shield layer and the insulation layer is increased, and a gap is less likely to occur between the insulation layer and the shield layer. Thus, a high shielding effect by the shield layer can be achieved.

A method for increasing the arithmetic average roughness Ra of the outer peripheral surface of the insulation layer may include, for example, performing a surface roughening treatment, such as blasting treatment, immersion in acidic or alkaline solution, immersion in chromic acid solution, and immersion in chelate solution.

Powder to be blasted to a treatment target in the blasting treatment may be powder comprising, for example, dry ice, metal particles, carbon particles, metal oxide particles, carbide particles, or nitride particles. Powder comprising dry ice is less likely to remain in the insulation layer after blasting treatment and thus is preferable.

In the blasting treatment, the arithmetic average roughness Ra of the outer peripheral surface of the insulation layer is increased as a speed of blasting the powder is increased. As a time of the blasting treatment is increased, the arithmetic average roughness Ra of the outer peripheral surface of the insulation layer is increased. As a distance between a tip of a nozzle blasting the powder and the outer peripheral surface of the insulation layer is reduced, the arithmetic average roughness Ra of the outer peripheral surface of the insulation layer is increased.

The arithmetic average roughness Ra of the outer peripheral surface of the insulation layer is preferably 5 μm or less. In this case, transmission loss can be reduced.

To measure the arithmetic average roughness Ra, for example, a measurement method using a laser microscope VK8500 produced by Keyence Corporation may be employed. An example of specific measurement conditions is as follow: In the outer peripheral surface of the insulation layer, mutually opposite two locations having flat surfaces or minimum curvatures are selected (hereinafter referred to as a "first measurement position" and a "second measurement position"). The "curvature" here may be, for example, a curvature of the outer peripheral surface of the insulation layer along a direction perpendicular to a longitudinal direction of the cable. Also, the two locations having minimum curvatures may be, for example, "two locations having a minimum average value of respective curvatures at the two locations". The curvature is an inverse of a curvature radius, and a minimum curvature corresponds to a maximum curvature radius. In the first measurement position, a rectangular measurement region is specified so as to have a length of 150 μm along the longitudinal direction of the cable and a length of 120 μm along a circumferential direction of the cable. The rectangular measurement region at the first measurement position may be, for example, a rectangular measurement region centered around the first measurement position or a rectangular measurement region including the first measurement position. In the measurement region, a first arithmetic average roughness Ra1 is measured using the aforementioned laser microscope. Similarly, in the second measurement position, a second arithmetic average roughness Ra2 is measured. Lastly, an average value of the first arithmetic average roughness Ra1 and the second arithmetic average roughness Ra2 is calculated, and the calculated average value is defined as the arithmetic average roughness Ra of the outer peripheral surface of the insulation layer. The arithmetic average roughness Ra is a value before forming the shield layer.

When the signal transmission cable of the present disclosure comprises two signal lines, it is preferable that the insulation layer collectively cover the two signal lines. To collectively cover means covering both of the two signal lines with an integrated insulation layer. When the insulation layer collectively covers the two signal lines, a gap between insulation layers does not occur unlike the case of separately covering each signal line. This enables reduction in variation in dielectric constant along the longitudinal direction of the signal transmission cable. Consequently, in a case where the signal transmission cable of the present disclosure is a differential signal transmission cable, a differential-to-common mode conversion quantity can be further reduced.

However, the insulation layer covering one of the two signal lines may be different from the insulation layer covering the other signal line.

In a section orthogonal to an extending direction of the signal line, an outer periphery of the insulation layer preferably has an oval or elliptical shape. This facilitates uniform surface roughening or surface modification over an entire outer peripheral surface of the insulation layer. The oval shape means a shape formed by two facing parallel straight lines and arcs each coupling corresponding ends of the straight lines.

Example materials usable for the insulation layer may include, polytetrafluoroethylene (PTFE), perfluoroalkoxy (PFA), perfluoro ethylene propene copolymer (FEP), ethylene-tetrafluoro ethylene copolymer (ETFE), tetrafluoro ethylene-perfluorodioxole copolymer (TFE/PDD), polyvinylidene fluoride (PVDF), polychloro-trifluoroethylene (PCTFE), ethylene-chloro-trifluoroethylene copolymer (ECTFE), polyvinyl fluoride (PVF), silicone, and polyethylene (PE).

The material for the insulation layer may be a foamable resin. When the material for the insulation layer is a foamable resin, the insulation layer has reduced dielectric constant and dielectric loss tangent. A method for manufacturing the insulation layer from a foamable resin may comprise, for example, kneading a resin and a foaming agent, and controlling temperature and pressure to cause foaming while forming the insulation layer. Another method for manufacturing the insulation layer from a foamable resin may comprise, for example, injecting nitrogen gas during compression molding of the insulation layer and thereafter reducing pressure to cause foaming.

The insulation layer may also be manufactured from a foamable resin as follows: Installing an extrusion nozzle having a desired shape to an extruder. Using the extruder to extrude a signal line and the foamable resin at the same time. The foamable resin forms the insulation layer.

(1-3) Shield Layer

The shield layer may comprise at least one selected from a group consisting of, for example, aluminum, aluminum alloy, copper, copper alloy, transition metal, and transition metal alloy. This enables removal or attenuation of electromagnetic noise.

The shield layer is configured, for example, with a plurality of stacked thin films. At least a part of the plurality of stacked thin films may be selected from, for example, a group consisting of an aluminum thin film, an aluminum alloy thin film, a copper thin film, a copper alloy thin film, a transition metal thin film, and a transition metal alloy thin film. This enables removal or attenuation of electromagnetic noise.

The shield layer may comprise, for example, an element exhibiting magnetism. This enables blocking of magnetism of a leaked magnetic field inside and outside the cable. The element exhibiting magnetism may be, for example, one or more selected from a group consisting of Fe, Co, Ni, and Gd.

The shield layer may comprise, for example, a rare earth element. This enables blocking of a leaked magnetic field inside and outside the cable. The rare earth element may be, for example, one or more selected from a group consisting of Tb, Dy, Ho, Er, and Tm.

The shield layer may comprise, for example, a precious metal element and/or a rare metal. This enables removal or attenuation of electromagnetic noise. Such an element may be, for example, one or more selected from a group consisting of Au, Ag, Pt, Pd, Rh, Ir, Ru, and Os. The shield layer may comprise, for example, a carbon nanotube. This enables removal or attenuation of electromagnetic noise.

The shield layer may be, for example, a plating layer. A method for forming the plating layer may include, for example, attaching a substance containing an element exhibiting a high catalytic activity to a surface of the insulation layer and performing plating. The substance containing an element exhibiting a high catalytic activity may include, for example, metal and metal oxide. The metal may include, for example, Pd and Pt. The metal oxide may include, for example, $TiO_2$.

A plating method may be, for example, electroplating, electroless plating, or a combination thereof. A plating bath may include, for example, a plating bath of sulfate compound solution, a plating bath of cyanide compound solution, and a plating bath of pyrophosphate compound solution.

The plating bath may be, for example, a plating bath of a copper compound solution having a copper ion valence of +2, a plating bath of a copper compound solution having a copper ion valence of +1, a plating bath of a mixed solution of a solution having a copper ion valence of +2 and a solution having a copper ion valence of +1.

The shield layer may be formed, for example, by a sputtering film forming method, an aerosol film forming method, and a Chemical Vapor Deposition (CVD) method. The shield layer may be formed by a combination of these methods. The shield layer may be formed, for example, by a method combining the sputtering film forming method and plating. The shield layer may be formed, for example, by a method combining the aerosol film forming method and plating. The shield layer may be formed, for example, by a method combining the CVD method and plating.

The shield layer may be configured, for example, by winding a tape having a conductive layer made of a conductive material around the outer peripheral surface of the insulation layer. The tape comprises, for example, an adhesive layer made of an adhesive. The adhesive layer enables adhesion of the tape to the insulation layer.

The material of the conductive layer included in the tape may be, for example, at least one selected from a group consisting of aluminum, aluminum alloy, copper, copper alloy, transition metal, and transition metal alloy.

The conductive layer included in the tape may be, for example, a single layer, or may be configured with a plurality of stacked thin films. At least a part of the plurality of stacked thin films may be, for example, selected from a group consisting of an aluminum thin film, an aluminum alloy thin film, a copper thin film, a copper alloy thin film, a transition metal thin film, and a transition metal alloy thin film.

2. Method for Manufacturing Signal Transmission Cable

Figure 3:
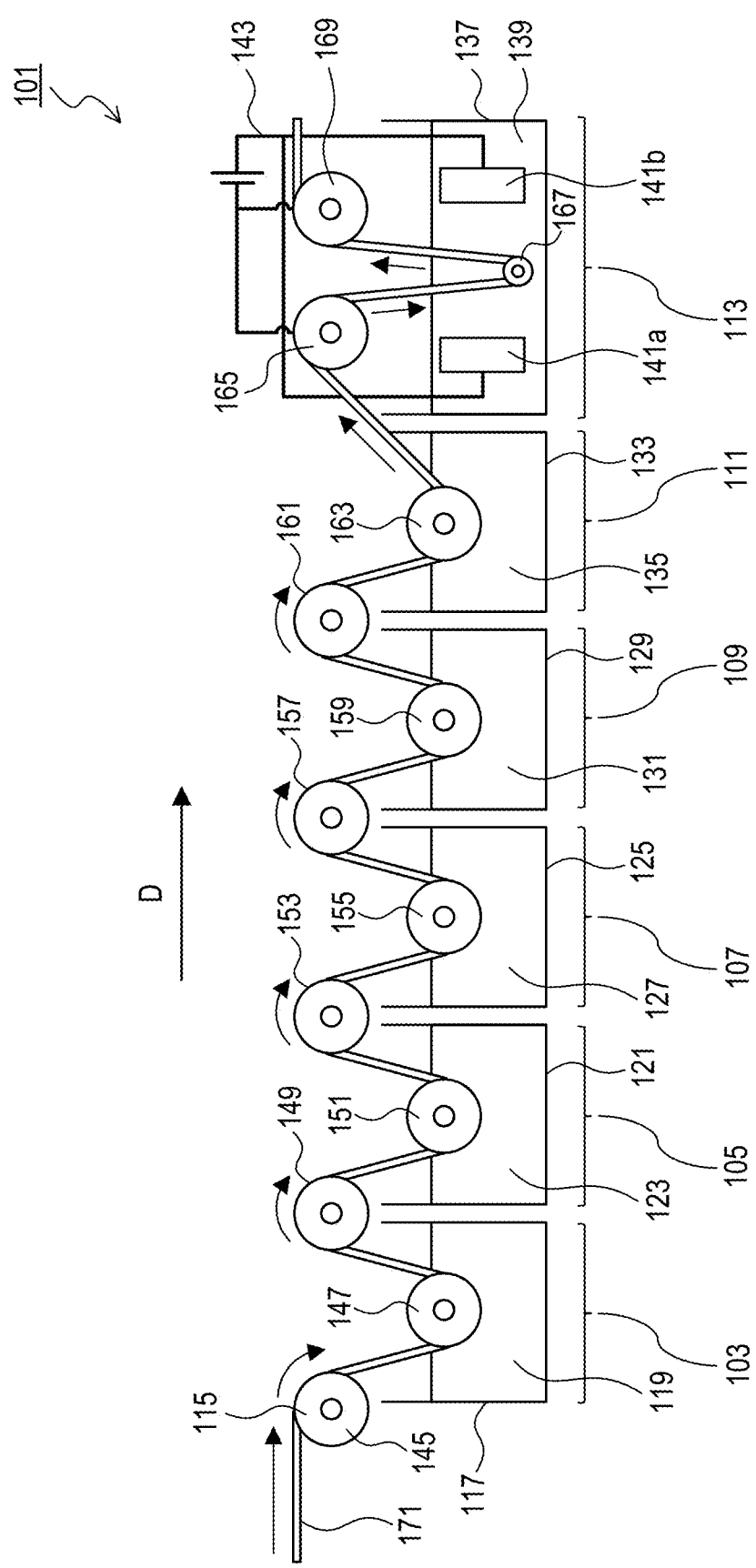
FIG. 3 is an explanatory view showing a configuration of a manufacturing system 101.

A signal transmission cable of the present disclosure may be manufactured, for example, by a method described below. FIG. 3 shows a manufacturing system 101 used for manufacturing a differential signal transmission cable. The differential signal transmission cable corresponds to the signal transmission cable. The manufacturing system 101 comprises a degreasing unit 103, a surface modification unit 105, a first activation unit 107, a second activation unit 109, an electroless plating unit 111, an electroplating unit 113, and a conveyer unit 115.

The degreasing unit 103 comprises a degreasing tank 117 and a degreasing solution 119. The degreasing solution 119 is contained in the degreasing tank 117. The degreasing solution 119 comprises, for example, at least one of sodium borate, sodium phosphate, or a surfactant. The degreasing solution 119 has a temperature of, for example, 40 to 60° C.

The surface modification unit 105 for performing surface modification treatment comprises a treatment tank 121 and a treatment solution 123. The treatment solution 123 is contained in the treatment tank 121. The treatment solution 123 comprises, for example, a permanganic acid solution. The treatment solution 123 has a temperature of, for example, 65 to 90° C.

The first activation unit 107 comprises a first activation tank 125 and a first activation solution 127. The first activation solution 127 is contained in the first activation tank 125. The first activation solution 127 comprises, for example, at least one of palladium chloride, stannous chloride, concentrated hydrochloric acid. The first activation solution 127 has a temperature of, for example, 30 to 40° C.

The second activation unit 109 comprises a second activation tank 129 and a second activation solution 131. The second activation solution 131 is contained in the second activation tank 129. The second activation solution 131 comprises, for example, sulfuric acid. The second activation solution 131 has a temperature of, for example, 0 to 50° C.

The electroless plating unit 111 comprises an electroless plating tank 133 and an electroless plating solution 135. The electroless plating solution 135 is contained in the electroless plating tank 133. The electroless plating solution 135 comprises, for example, copper sulfate, Rochelle salt, formaldehyde, and sodium hydroxide. The electroless plating solution 135 has a temperature of, for example, 20 to 30° C.

The electroplating unit 113 comprises an electroplating tank 137, an electroplating solution 139, a first anode 141a and a second anode 141b, and a power supply unit 143. The electroplating solution 139 is contained in the electroplating tank 137. The electroplating solution 139 has a composition, for example, as shown in Table 1 or Table 2. The electroplating solution 139 has a temperature of, for example, 20 to 25° C.

TABLE 1

Composition of Copper Sulfate Plating Bath

| Composition of Plating Bath | Chemical Formula | Concentration (g/l) |
|---|---|---|
| Copper sulfate | $CuSO_4 \cdot 5H_2O$ | 60-250 |
| Metal copper | Cu | 15-70 |
| Sulfuric acid | $H_2SO_4$ | 25-220 |
| Chlorine ion (Sodium chloride, Hydrochloric acid) | $Cl^-$ (NaCl, HCl) | 0.02-0.2 |

TABLE 2

Composition of Copper Cyanide Plating Bath

| Composition of Plating Bath | Chemical Formula | Concentration (g/l) |
|---|---|---|
| Cuprous cyanide | CuCN | 20-80 |
| Sodium cyanide (Potassium cyanide) | NaCN (KCN) | 25-130 |
| Free sodium cyanide (Free potassium cyanide) | NaCN (KCN) | 5-25 |
| Potassium sodium tartrate | $KNaC_4H_4O_6 \cdot 4H_2O$ | 15-60 |
| Sodium carbonate (Potassium carbonate) | $Na_2CO_3$ ($K_2CO_3$) | 10-30 |
| Potassium hydroxide (Sodium hydroxide) | KOH (NaOH) | 10-20 |

The first and second anodes 141a, 141b are immersed in the electroplating solution 139. The first and second anodes 141a, 141b are each obtained, for example, by casting and roll-forging of molten copper produced from copper melt. Alternatively, the first and second anodes 141a, 141b may be manufactured as described below. Starting-sheet electrolysis is performed using crude copper as an anode and stainless-steel or titanium as a cathode. Pure copper plates deposited on a surface of the cathode are removed and used as the first and second anodes 141a, 141b. A power supply unit 143 applies a direct current voltage between the first and second anodes 141a, 141b, and bobbins 165, 169, which will be described below.

The conveyer unit 115 comprises a plurality of bobbins 145, 147, 149, 151, 153, 155, 157, 159, 161, 163, 165, 167, and 169. Hereinafter, these bobbins may also be referred to as bobbins collectively. The bobbins 165 and 169 are electrically conductive. The bobbin 167 has an insulating property.

As shown in FIG. 3, the bobbins are basically arranged in series along a conveying direction D. The conveying direction D is a direction from the degreasing unit 103 toward the electroplating unit 113 via the surface modification unit 105, the first activation unit 107, the second activation unit 109, and the electroless plating unit 111 in this order.

A part of the bobbin 147 is immersed in the degreasing solution 119. A part of the bobbin 151 is immersed in the treatment solution 123. A part of the bobbin 155 is immersed in the first activation solution 127. A part of the bobbin 159 is immersed in the second activation solution 131. A part of the bobbin 163 is immersed in the electroless plating solution 135. The bobbin 167 is entirely immersed in the electroplating solution 139.

The conveyer unit 115 continuously conveys the differential signal transmission cable 171 through the bobbins in the conveying direction D. The differential signal transmission cable 171 to be conveyed has the signal line(s) and the insulation layer in an initial state, but the plating layer is not yet formed. The insulation layer may be prepared by, for example, publicly known extrusion molding.

The differential signal transmission cable 171 to be conveyed is first immersed in the degreasing solution 119 in the degreasing unit 103 for 3 to 5 minutes. Then, grease smeared on the surface of the insulation layer is removed.

Subsequently, the differential signal transmission cable 171 is immersed in the treatment solution 123 in the surface modification unit 105 for 8 to 15 minutes. Thus, for example, the $A_1/A_2$ ratio is increased. Also, for example, the contact angle on the outer peripheral surface of the insulation layer is reduced. Further, for example, the adhesion-wetting surface energy on the outer peripheral surface of the insulation layer is increased. In addition, for example, the first amount of the hydroxy group on the outer peripheral surface of the insulation layer is increased.

Subsequently, the differential signal transmission cable 171 is immersed in the first activation solution 127 in the first activation unit 107 for 1 to 3 minutes. Thus, a catalyst layer is formed on the outer peripheral surface of the insulation layer.

Subsequently, the differential signal transmission cable 171 is immersed in the second activation solution 131 in the second activation unit 109 for 3 to 6 minutes. Thus, a surface of the catalyst layer is cleaned.

Subsequently, the differential signal transmission cable 171 is immersed in the electroless plating solution 135 in the electroless plating unit 111. An immersion time is, for example, 10 minutes or less. Thus, an electroless plating layer is formed on the outer peripheral surface of the insulation layer. The electroless plating layer becomes thicker as the immersion time in the electroless plating solution 135 lengthens.

Subsequently, the differential signal transmission cable 171 is immersed in the electroplating solution 139 in the electroplating unit 113. An immersion time is, for example, 3 minutes or less. Thus, an electroplating layer is formed on an outer peripheral surface of the electroless plating layer.

The electroless plating layer and the electroplating layer correspond to the shield layer. The electroplating layer becomes thicker as the immersion time in the electroplating solution 139 lengthens. Table 3 shows specific conditions of the electroplating in the electroplating unit 113. Manufacture of the differential signal transmission cable 171 is completed through the aforementioned steps.

TABLE 3

Conditions for Electroplating by Copper Sulfate Plating Bath

| Items | Control Value |
| --- | --- |
| Bath temperature (° C.) | 20-25 |
| Cathode current density (A/dm$^2$) | 1-6 |
| Anode current density (A/dm$^2$) | 2.5 or less |
| Bath voltage (V) | 1-6 |
| Agitation method | Air agitation |
| Filtration | Continuous filtration, at least 3 times/hour |
| Anode | Phosphorus-containing copper |
| Anode bag | Saran ® fiber, etc. |

Although not indicated in FIG. 3, the differential signal transmission cable 171 is cleaned with pure water between the units. A method of cleaning may include ultrasonic cleaning, oscillation cleaning, and running water cleaning. The cleaning with pure water helps to reduce residues of agents attached in a previous unit being brought into a subsequent unit.

Conveying speed of the differential signal transmission cable 171 may be appropriately adjusted. The conveying speed may be changed during the conveyance, or the conveyance may be suspended.

Figure 4:
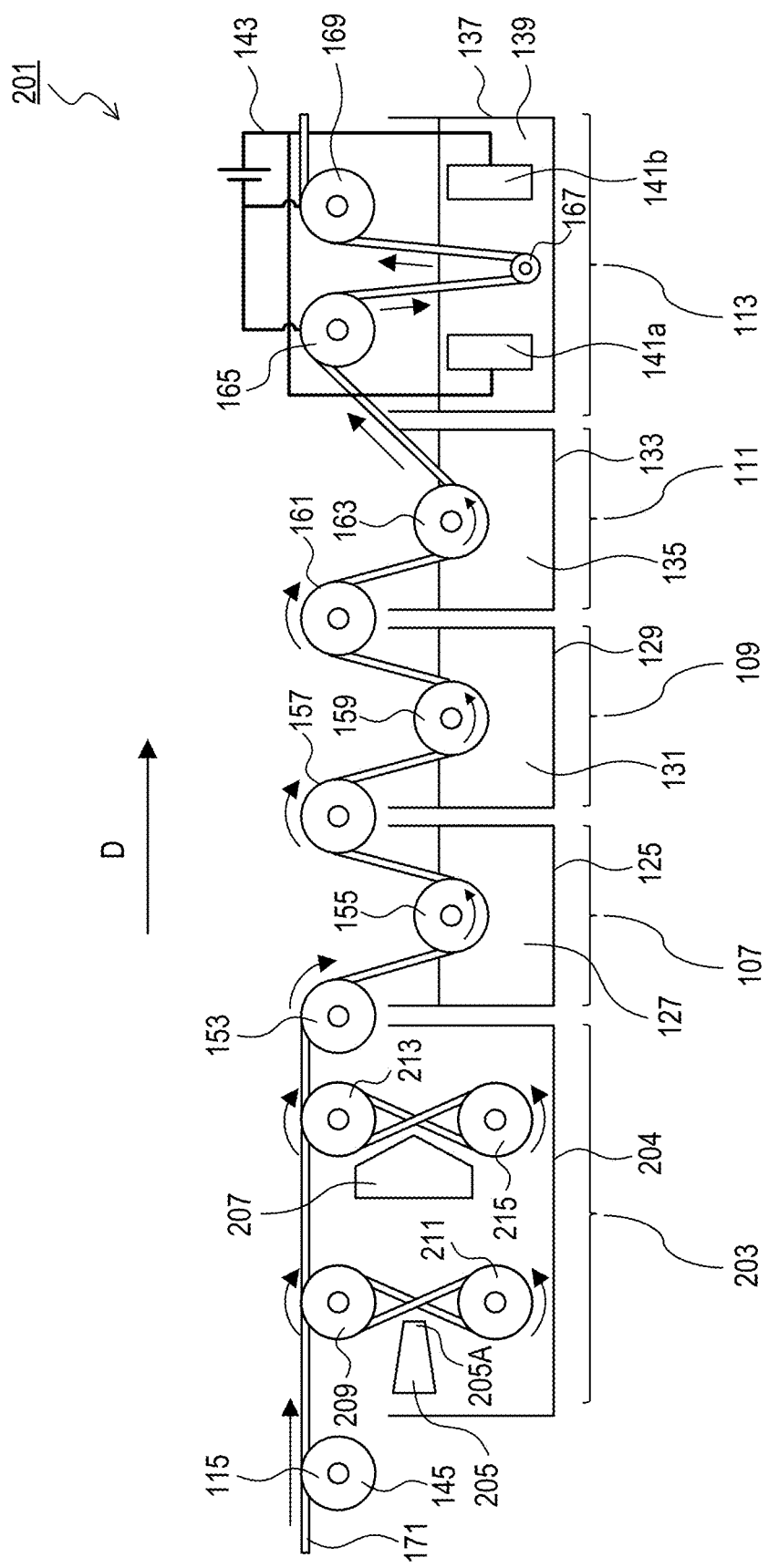
FIG. 4 is an explanatory view showing a configuration of a manufacturing system 201.

The differential signal transmission cable may be manufactured by using a manufacturing system 201 shown in FIG. 4. The manufacturing system 201 has a configuration that is basically the same as, but partially different from, that of the manufacturing system 101. The description hereinafter will focus on such differences. The manufacturing system 201 does not comprise the degreasing unit 103 or the surface modification unit 105, but comprises a surface modification unit 203.

The surface modification unit 203 comprises a housing 204, a fine-shape forming device 205, and a hydrophilic treatment device 207. The housing 204 houses components of the surface modification unit 203. Along the conveying direction D, the housing 204 comprises an inlet in its upstream end, and an outlet in its downstream end.

The conveyer unit 115 comprises, in the housing 204, four bobbins 209, 211, 213, and 215. The bobbin 145 guides the differential signal transmission cable 171 into the housing 204 through the inlet. The guided differential signal transmission cable 171 is conveyed along a figure-eight path traveling from the bobbin 209 to the bobbin 211 and returning to the bobbin 209. The differential signal transmission cable 171 is then conveyed from the bobbin 209 to the bobbin 213, and further conveyed along a figure-eight path traveling from the bobbin 213 to the bobbin 215 and returning to the bobbin 213. Subsequently, the differential signal transmission cable 171 guided to exit from the outlet to the bobbin 153 and conveyed to the first activation unit 107.

The fine-shape forming device 205 blasts fine particles of dry ice from a nozzle 205A against the differential signal transmission cable 171 that is situated between the bobbin 209 and the bobbin 211. The blast is driven by an air pressure. The arithmetic average roughness Ra of the outer peripheral surface of the insulation layer increases due to the collision with the fine particles of dry ice. For this purpose, the fine-shape forming device 205 performs dry ice blasting. The dry ice blasting corresponds to the surface roughening treatment.

The outer peripheral surface of the insulation layer turns its first side to the nozzle 205A when conveyed from the bobbin 209 to the bobbin 211 and turns its second side to the nozzle 205A when returned from the bobbin 211 to the bobbin 209. This enables the fine-shape forming device 205 to increase the arithmetic average roughness Ra over the entire area of the outer peripheral surface of the insulation layer.

Particle sizes of fine particles of dry ice, a distance between the tip of the nozzle 205A and differential signal transmission cable 171, and other particulars may be appropriately specified. The differential signal transmission cable 171 has a temperature of, for example, 20° C.

Conditions of the dry ice blasting may be appropriately changed. The conditions may include, for example, the particle sizes of the fine particles of dry ice, a flow rate of dry ice, an air pressure, the distance between the tip of the nozzle 205A and the differential signal transmission cable 171, the conveying speed of the differential signal transmission cable 171, and the temperature of the differential signal transmission cable 171. For example, the dry ice blasting may be performed at a temperature lower than a glass transition temperature of a material of the insulation layer. Such a lower temperature may be, for example, a temperature between −79° C. and 20° C. inclusive. The nozzle 205A may be fixed in a position, may oscillate, or may scan.

The hydrophilic treatment device 207 performs hydrophilic treatment by corona discharge exposure. The corona discharge exposure corresponds to the surface modification treatment. The corona discharge exposure hydrophilizes the outer peripheral surface of the insulation layer and improves the wettability. Improved wettability increases the $A_1/A_2$ ratio and reduces the contact angle on the outer peripheral surface of the insulation layer, resulting in an increased absolute value of the adhesion-wetting surface free energy on the outer peripheral surface of the insulation layer, and an increase in the first amount of the hydroxy group on the outer peripheral surface of the insulation layer.

A mechanism that the corona discharge exposure hydrophilizes the outer peripheral surface of the insulation layer and improves the wettability is assumed as below. High energy electrons generated by the corona discharge exposure ionize and/or dissociate oxygen molecules in the air and produce oxygen radical, ozone, and so forth. Simultaneously, the high energy electrons that reach the proximity of the outer peripheral surface of the insulation layer cut and cleave main chains and side chains of, for example, polyethylene and FEP included in the insulation layer. The aforementioned oxygen radical, ozone, and so forth generated by the corona discharge exposure are recombined with these cleaved main chains and side chains to form polar functional groups, such as the hydroxy group and the carbonyl group, on the outer peripheral surface of the insulation layer. As a result, the outer peripheral surface of the insulation layer is hydrophilized and has an improved wettability.

For example, the voltage applied in the corona discharge exposure is in a range from 2 to 14 kV, and the frequency is 15 kHz. A distance between the outer peripheral surface of the insulation layer and a plate electrode is, for example, between 0.1 to 3 mm inclusive. The ambience inside the housing 204 is, for example, the atmospheric air.

Conditions of the corona discharge exposure may be appropriately changed. The conditions may comprise, for example, a magnitude of the applied voltage, a frequency of the applied voltage, a distance between the outer peripheral surface of the insulation layer and the plate electrode, and the ambience inside the housing 204. The ambience inside the housing 204 may comprise oxygen, nitrogen, carbon dioxide, and a rare gas. A material such as silicone rubber may be interposed between the outer peripheral surface of the insulation layer and the plate electrode. In this case, the plate electrode indirectly contacts the insulation layer and slides against the silicone rubber during the corona discharge.

An exhaust ventilation system to discharge the air inside the housing 204 and/or a dryer to dry an inside space of the housing 204 may be arranged. This helps to reduce rust of the differential signal transmission cable 171. A neutralization apparatus may also be arranged in the housing 204. This helps to reduce static electricity in the housing 204.

As described above, the method for manufacturing the differential signal transmission cable using the manufacturing system 201 comprises the dry ice blasting on the outer peripheral surface of the insulation layer, followed by the corona discharge exposure on the outer peripheral surface of the insulation layer, and the subsequent formation of the plating layer on the outer peripheral surface of the insulation layer.

Immersion in the permanganic acid solution may further be performed subsequent to the corona discharge exposure. The immersion in the permanganic acid solution further increases the $A_1/A_2$ ratio, further reduces the contact angle on the outer peripheral surface of the insulation layer, resulting in a further increased absolute value of the adhesion-wetting surface free energy on the outer peripheral surface of the insulation layer, and a further increased first amount of the hydroxy group on the outer peripheral surface of the insulation layer. The immersion in the permanganic acid solution may be performed subsequent to the surface roughening treatment and followed by the corona discharge exposure. Signal transmission cables other than the differential signal transmission cable can be manufactured by methods similar to those described above.

3. Examples (3-1) Example 1

Plate-shaped samples of polyethylene were prepared. The samples each correspond to the insulation layer. Surface modification treatments J1A to J1H were performed to the respective samples. The surface modification treatments each include the dry ice blasting, the subsequent immersion in the permanganic acid solution, and the further subsequent degreasing. The surface modification treatments J1A to J1H are under different conditions in terms of blasting pressure during the dry ice blasting and intensity of degreasing. Specifically, the conditions of the surface modification treatments are such that the blasting pressure during the dry ice blasting and the intensity of degreasing are lowered in the order of J1A, J1B, J1C, J1D, J1E, J1F, J1G, and J1H.

Figure 5:
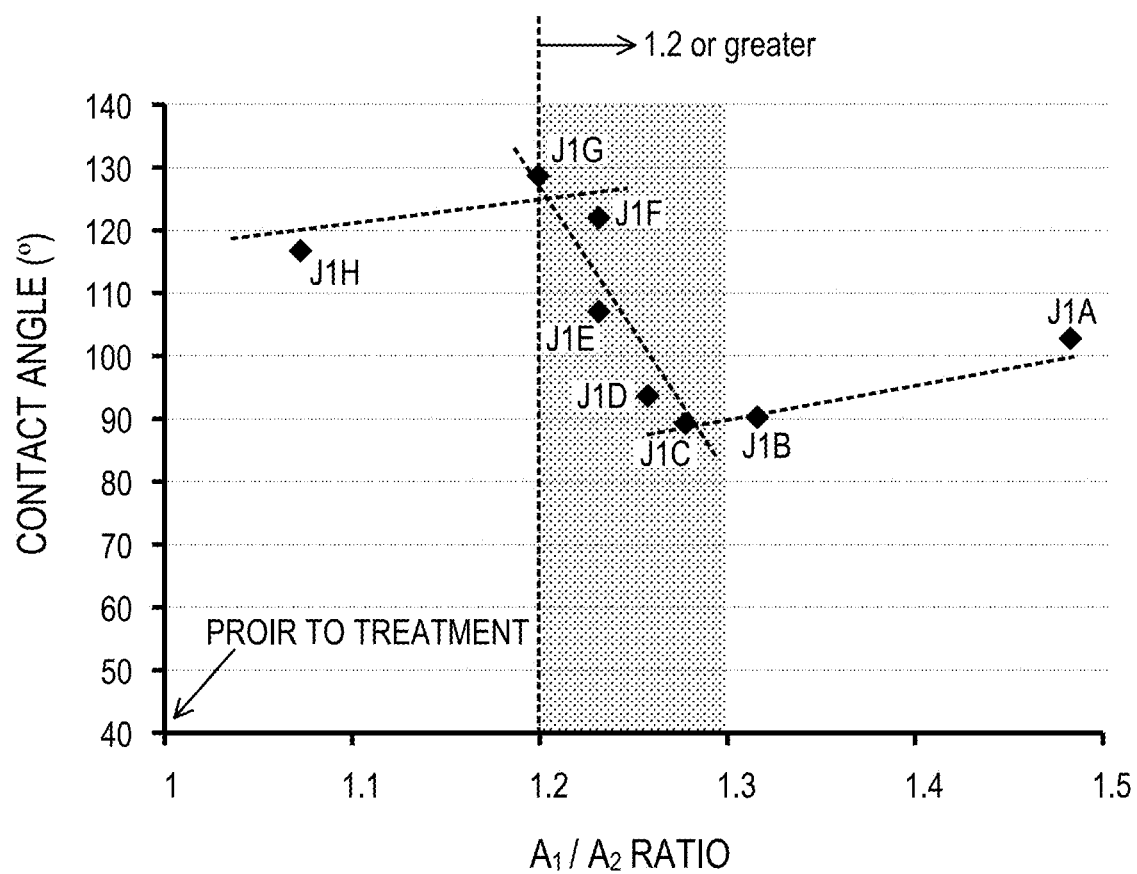
FIG. 5 is a graph showing an $A_1/A_2$ ratio after a surface modification treatment and a contact angle on a surface of each sample.
Figure 6:
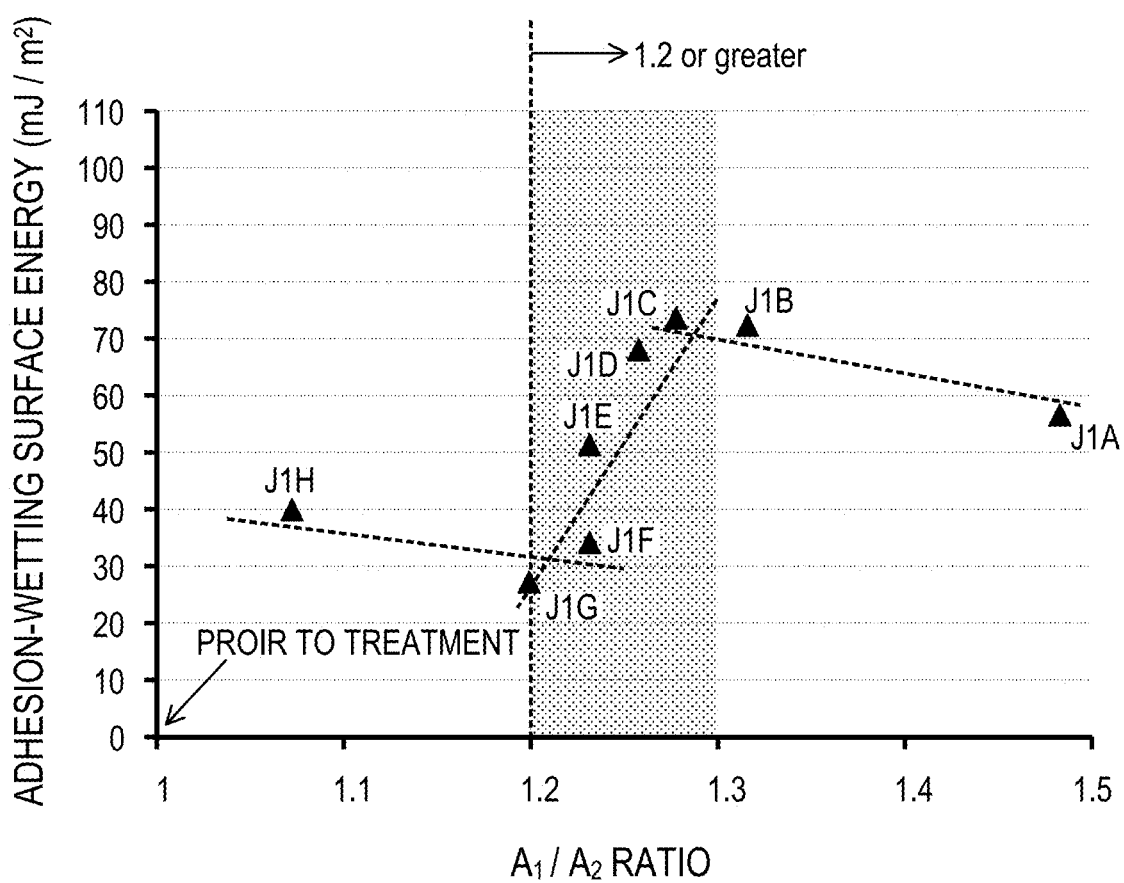
FIG. 6 is a graph showing an $A_1/A_2$ ratio after a surface modification treatment and an adhesion-wetting surface energy on a surface of each sample.

After each of the surface modification treatments, the $A_1/A_2$ ratio, the contact angle on the surface of the sample, and the adhesion-wetting surface energy on the surface of the sample were measured. FIG. 5 shows measurement results of the $A_1/A_2$ ratio and the contact angle on the surface of each of the samples. FIG. 6 shows measurement results of the $A_1/A_2$ ratio and the adhesion-wetting surface energy on the surface of each of the samples.

As shown in FIG. 5, when the $A_1/A_2$ ratio was in a range of 1.2 to 1.3, the contact angle on the surface of the sample was reduced as the $A_1/A_2$ ratio increased. Sufficient surface modification treatment enabled the $A_1/A_2$ ratio to be 1.2 or greater, and the contact angle on the surface of the sample to be 130° or less. The contact angle in the case of J1G is 128.7°.

As shown in FIG. 6, when the $A_1/A_2$ ratio was in a range of 1.2 to 1.3, the adhesion-wetting surface energy on the surface of each of the samples increased as the $A_1/A_2$ ratio increased. Sufficient surface modification treatment enabled the $A_1/A_2$ ratio to be 1.2 or greater, and the adhesion-wetting surface energy on the surface of the sample to be 27 mJ/m$^2$ or greater. The adhesion-wetting surface energy in the case of J1G is 27.3 mJ/m$^2$.

(3-2) Example 2

A plate-shaped sample of polyethylene was prepared. This sample corresponds to the insulation layer. A surface modification treatment was performed to the sample. The surface modification treatment was immersion in permanganic acid solution.

Figure 7A:
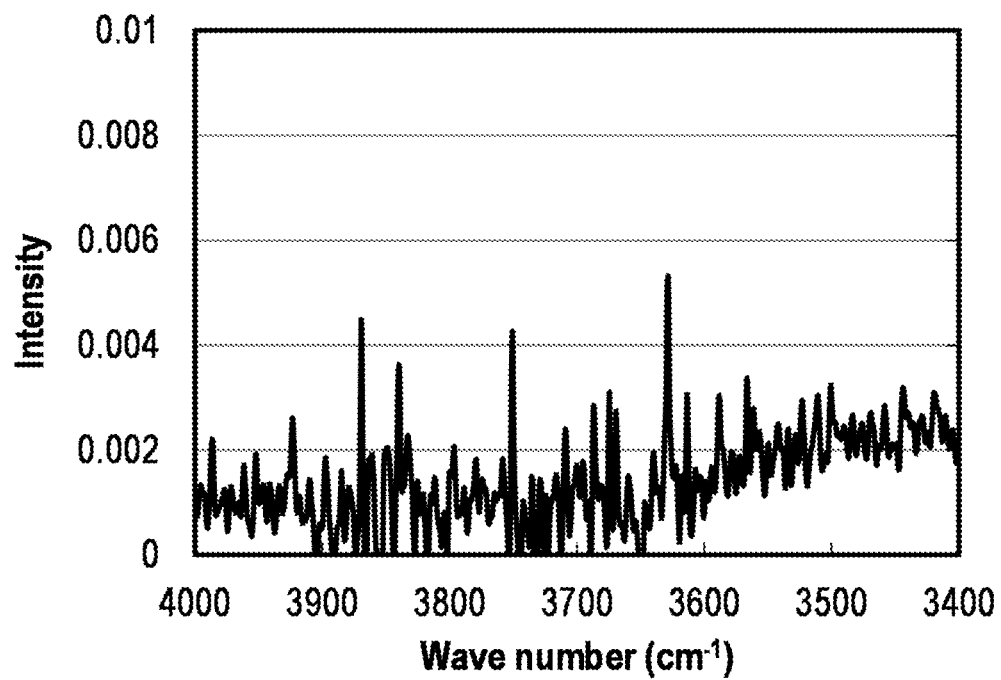
FIG. 7A is a graph showing an infrared absorption spectrum inside a sample.
Figure 7B:
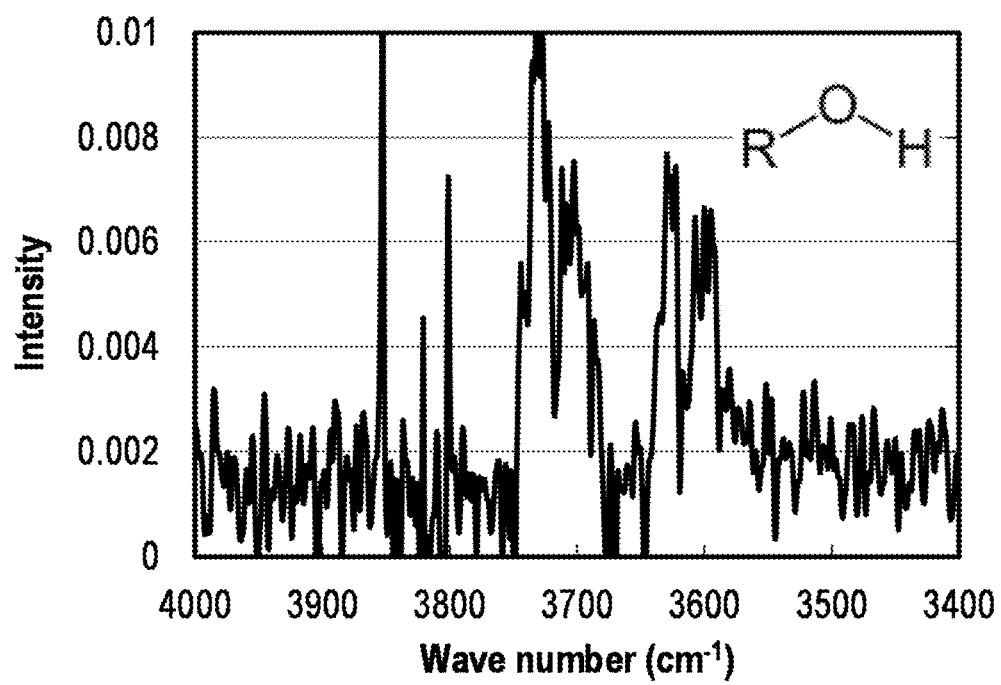
FIG. 7B is a graph showing an infrared absorption spectrum on a surface of a sample.

An infrared absorption spectrum in the first measurement region 13 was measured by using the FT-IR, and FIG. 7B shows results of the measurement. In the infrared absorption spectrum shown in FIG. 7B, a peak corresponding to the hydroxy group was detected. An infrared absorption spectrum in the second measurement region 15 was measured, and FIG. 7A shows results of the measurement. In the infrared absorption spectrum shown in FIG. 7A, a peak corresponding to the hydroxy group was not detected.

In Example 2, the first measurement region 13 was specified on the surface of the plate-shaped sample, and the second measurement region 15 was specified on a section of the plate-shaped sample. A distance D between the second measurement region 15 and the surface of the sample was 10 μm.

The surface modification treatment enabled the first amount of the hydroxy group on the surface of the sample to be greater than the second amount of the hydroxy group inside the sample. It is assumed that the reason for increase in the $A_1/A_2$ ratio and reduction in the contact angle on the outer peripheral surface of the insulation layer caused by the surface modification treatment is that the first amount of the hydroxy group on the outer peripheral surface of the insulation layer increases.

(3-3) Example 3

Plate-shaped samples of polyethylene were prepared. A sample not yet treated (hereinafter, an "untreated sample") exhibited the $A_1/A_2$ ratio, the contact angle on the surface of the untreated sample, the adhesion-wetting surface energy on the surface of the untreated sample, the arithmetic average roughness Ra on the surface of the untreated sample as shown in Table 4.

TABLE 4

|  | Untreated | J3A | J3B |
|---|---|---|---|
| $A_1/A_2$ ratio | 1 | 1.32 | 1.23 |
| Contact angle (°) | 94 | 90 | 120 |

TABLE 4-continued

|  | Untreated | J3A | J3B |
|---|---|---|---|
| Adhesion-wetting surface energy (mJ/m$^2$) | 68 | 73 | 34 |
| Arithmetic average roughness Ra (μm) | 0.1 | 0.16 | 3.4 |

A surface modification treatment J3A was performed to an untreated sample. The surface modification treatment J3A included roughening treatment and immersion in permanganic acid solution. The sample after the surface modification treatment J3A exhibited the $A_1/A_2$ ratio, the contact angle on the surface of the sample, the adhesion-wetting surface energy on the surface of the sample, and the arithmetic average roughness Ra on the surface of the sample as shown in Table 4.

A surface modification treatment J3B was performed to an untreated sample. The surface modification treatment J3B included roughening treatment and immersion in permanganic acid solution. The sample after the surface modification treatment J3B exhibited the $A_1/A_2$ ratio, the contact angle on the surface of the sample, the adhesion-wetting surface energy on the surface of the sample, and the arithmetic average roughness Ra on the surface of the sample as shown in Table 4.

Electroless copper plating was performed to each of the untreated sample, the sample after the surface modification treatment J3A, and the sample after the surface modification treatment J3B.

Figure 8A:
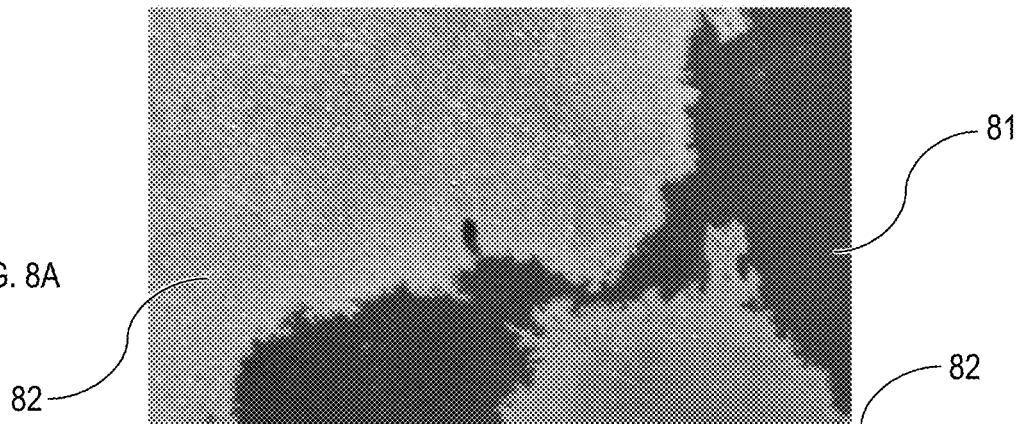
FIG. 8A is a photograph showing an appearance of an untreated sample subjected to electroless copper plating.

FIG. 8A shows an appearance of the untreated sample after the electroless copper plating. Both a non-copper-plated area 81, in which copper plating was not formed, and a copper plated area 82, in which copper plating was formed, were present.

Figure 8B:
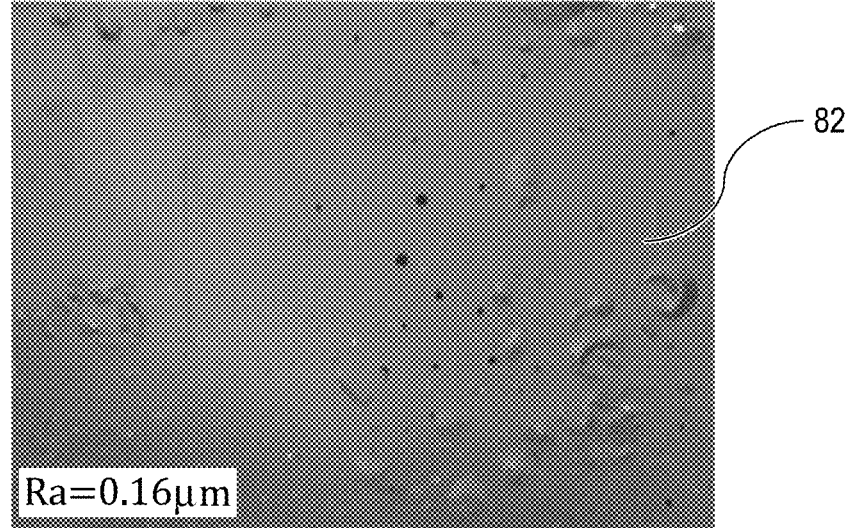
FIG. 8B is a photograph showing an appearance of a sample subjected to a surface modification treatment J3A and subsequent electroless copper plating.

FIG. 8B shows an appearance of the sample subjected to the surface modification treatment J3A and the subsequent electroless copper plating. The copper plated area 82 was present over an entire surface of the sample. The reason is assumed to be as follows: The sample subjected to the surface modification treatment J3A had an improved wettability on the surface of the sample. Thus, a plating solution spread over the entire surface of the sample, resulting in formation of a uniform plating layer. The surface of the sample subjected to the surface modification treatment J3A had plating bulges called blisters.

Figure 8C:
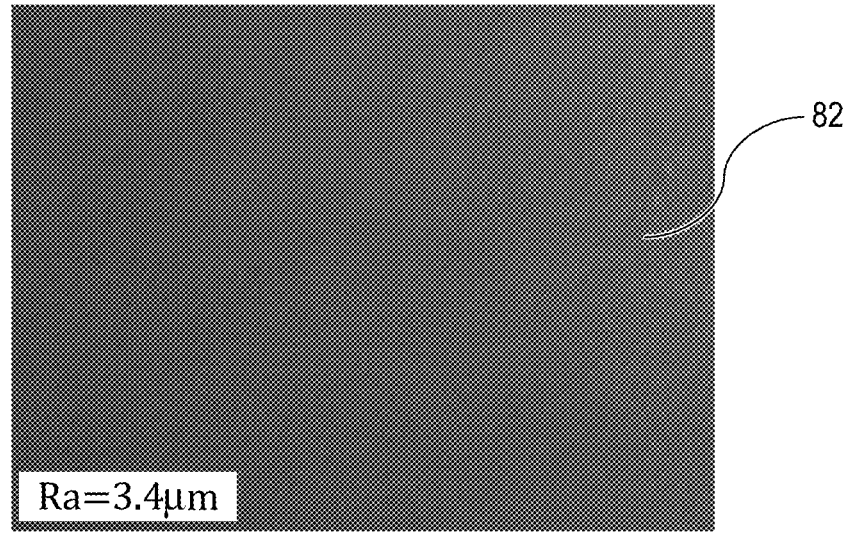
FIG. 8C is a photograph showing an appearance of a sample subjected to a surface modification treatment J3B and subsequent electroless copper plating.

FIG. 8C shows an appearance of the sample subjected to the surface modification treatment J3B and the subsequent electroless copper plating. The copper plated area 82 was present over an entire surface of the sample. The reason is assumed to be the same as that in the case of the sample subjected to the surface modification treatment J3A. No blister was present on the sample subjected to the surface modification treatment J3B. The reason for the absence of blister is assumed to be a large arithmetic average roughness Ra on the surface of the sample.

(3-4) Example 4

Signal transmission cables not yet having a shield layer were prepared. The signal transmission cables each had an insulation layer of polyethylene. Surface modification treatments J4A to J4F were performed to the respective insulation layers. The surface modification treatments J4A to J4C each included immersion in permanganic acid solution. The surface modification treatments J4D to J4F each did not include immersion in permanganic acid solution. The surface modification treatments J4A, J4B, J4D, and J4E each included roughening treatment. The arithmetic average roughness Ra on the outer peripheral surface of the insulation layer after the surface modification treatment becomes smaller in the order of J4D, J4E, J4A, J4B, J4F, and J4C.

After the surface modification treatments J4A to J4F, the cables each exhibited the $A_1/A_2$ ratio, the contact angle on the outer peripheral surface of the insulation layer, the adhesion-wetting surface energy on the outer peripheral surface of the insulation layer, and the arithmetic average roughness Ra on the outer peripheral surface of the insulation layer as shown in Table 5.

TABLE 5

|  | J4A | J4B | J4C | J4D | J4E | J4F |
|---|---|---|---|---|---|---|
| A1/A2 ratio | 1.16 | 1.16 | 1.24 | 1.14 | 1.23 | 1.24 |
| Contact angle (°) | 121.9 | 122.2 | 106.1 | 79.3 | 117.8 | 111.0 |
| Adhesion-wetting surface energy (mJ/m$^2$) | 34 | 34 | 53 | 86 | 39 | 47 |
| Arithmetic average roughness Ra (μm) | 3.3 | 2.4 | 1.0 | 5.7 | 3.8 | 1.3 |

Figure 9A:
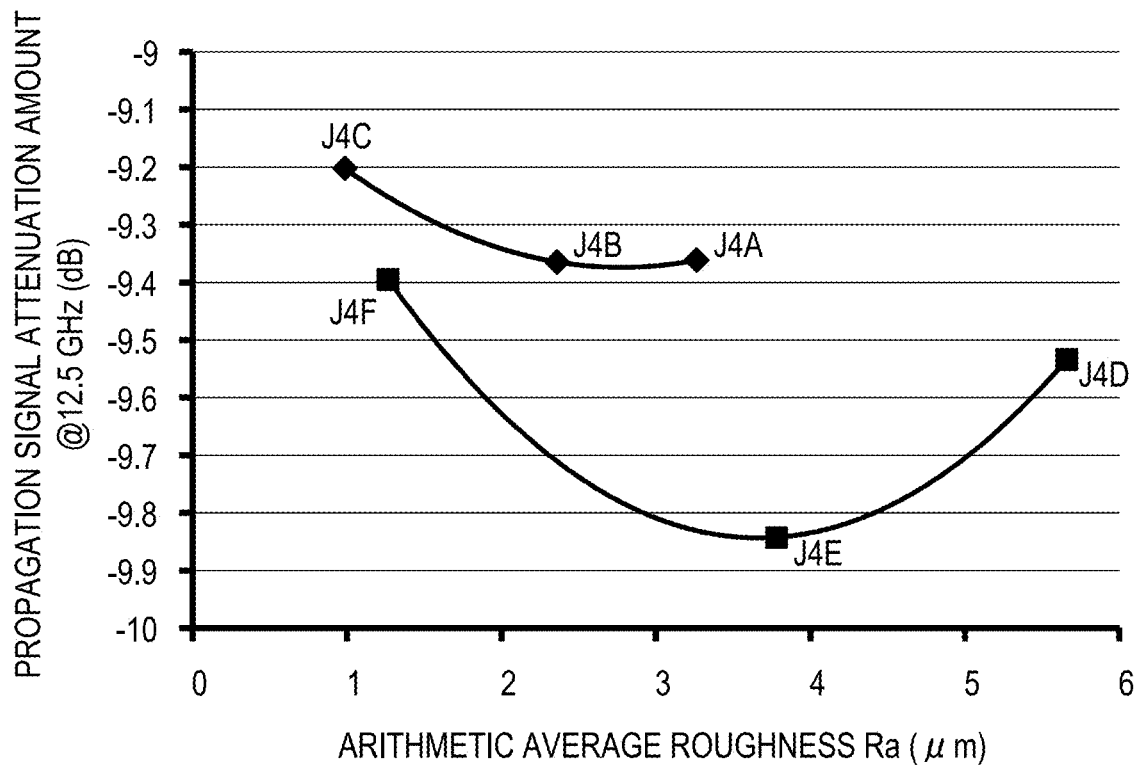
FIG. 9A is a graph showing results of measurement of a propagation signal attenuation amount at a frequency of 12.5 GHz with respect to a signal transmission cable produced in Example 4.
Figure 9B:
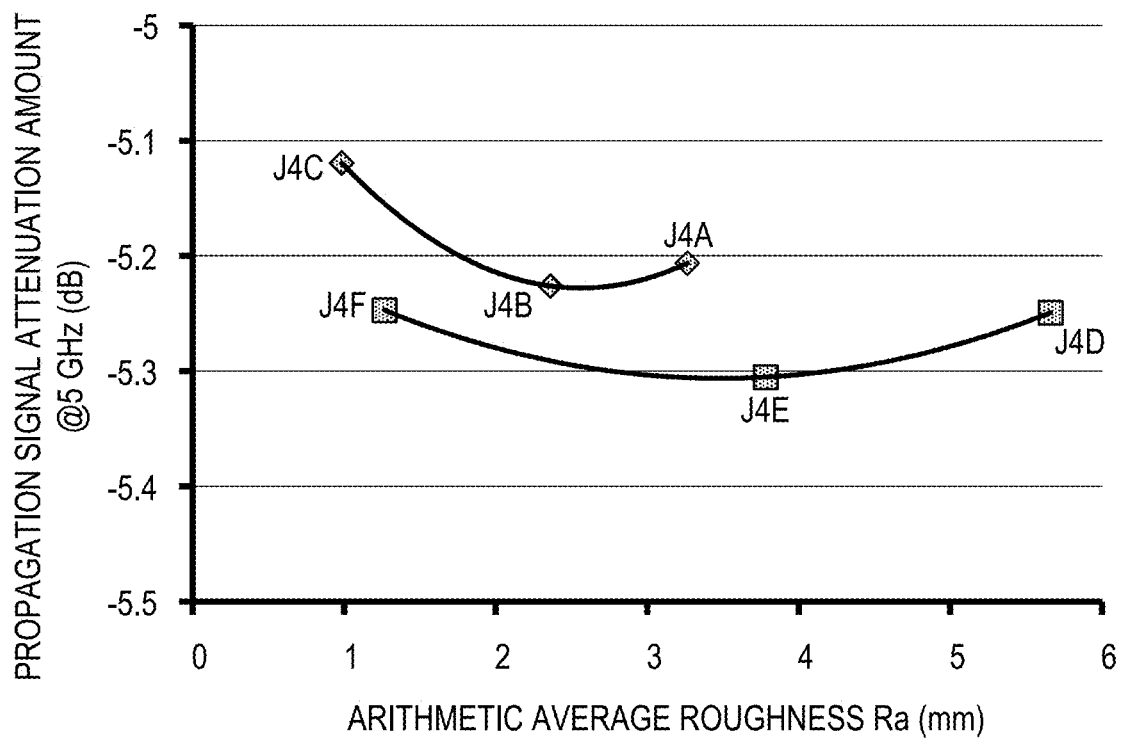
FIG. 9B is a graph showing results of measurement of a propagation signal attenuation amount at a frequency of 5 GHz with respect to the signal transmission cable produced in Example 4.

Subsequently, a shield layer was formed by copper plating on the outer peripheral surface of the insulation layer to finish each of the signal transmission cables. A propagation signal attenuation amount of each of the finished signal transmission cables was measured at a frequency of 12.5 GHz, the results of which are shown in FIG. 9A. Also, a propagation signal attenuation amount of each of the finished signal transmission cables was measured at a frequency of 5 GHz, the results of which are shown in FIG. 9B.

The cables subjected to the surface modification treatments J4A to J4C exhibited respective propagation signal attenuation amounts smaller than those of the cables subjected to the surface modification treatments J4D to J4F. The reason is assumed to be the following: The surface modification treatments J4A to J4C each caused the shield layer to be a uniform metal thin film; thus, the shield layer had a reduced resistivity and a reduced propagation signal attenuation amount.

Figure 10A:
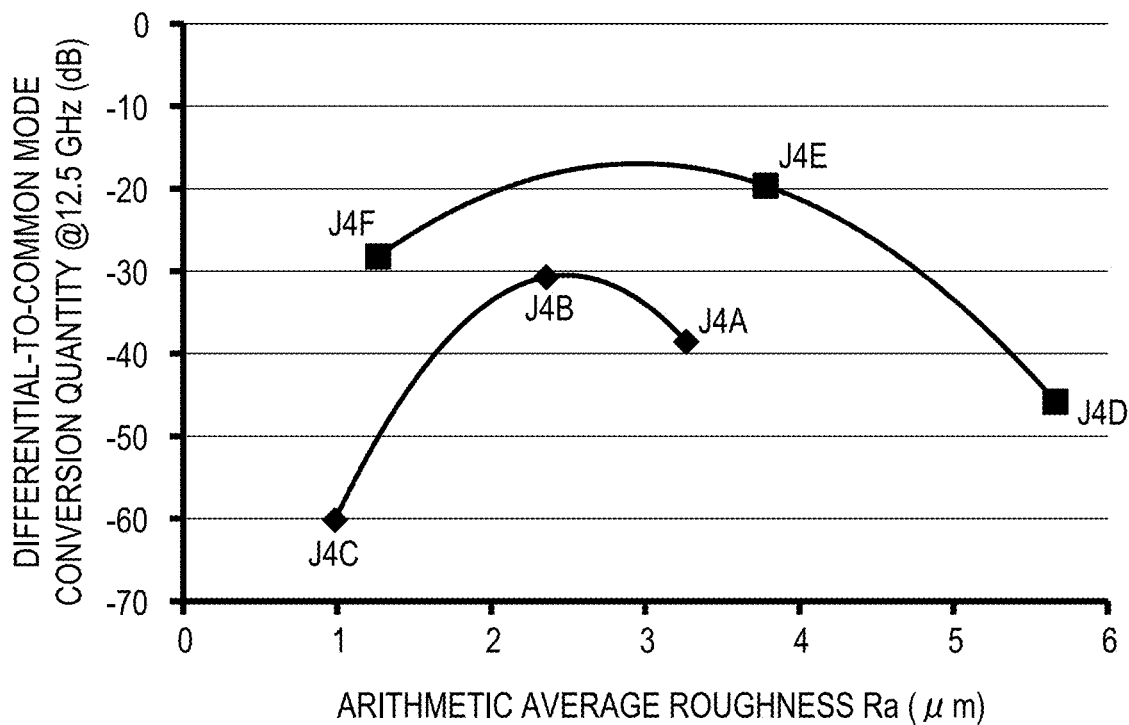
FIG. 10A is a graph showing results of measurement of a differential-to-common mode conversion quantity at a frequency of 12.5 GHz with respect to the signal transmission cable produced in Example 4.
Figure 10B:
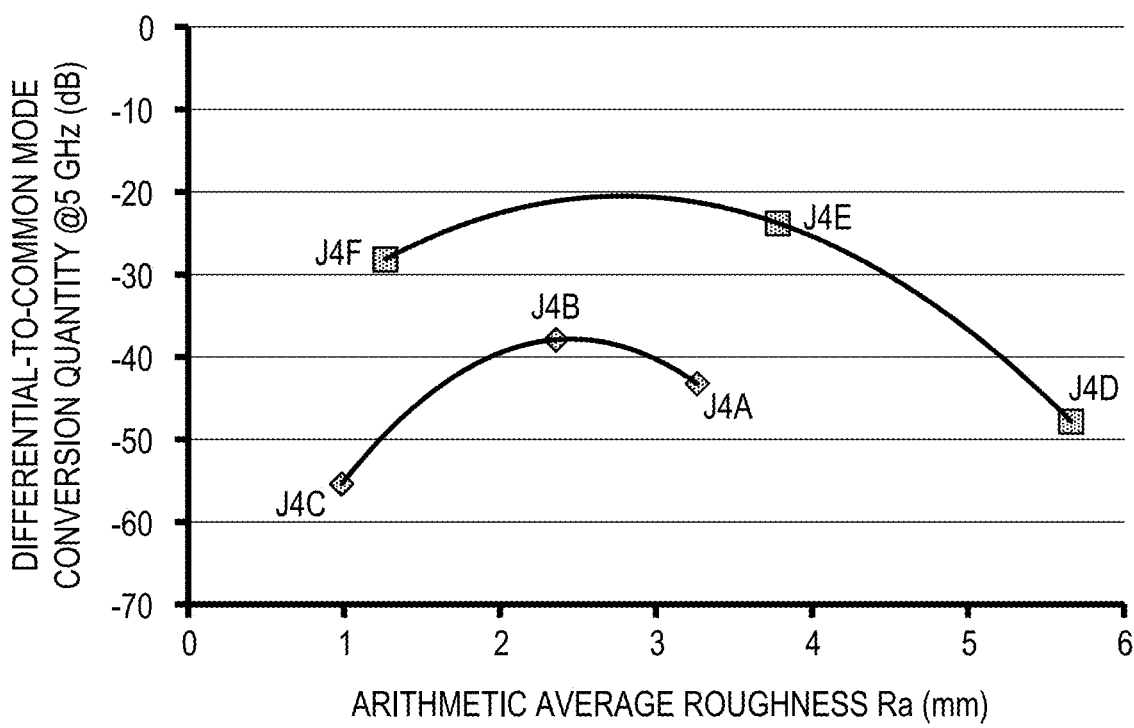
FIG. 10B is a graph showing results of measurement of a differential-to-common mode conversion quantity at a frequency of 5 GHz with respect to the signal transmission cable produced in Example 4.

A differential-to-common mode conversion quantity of each of the finished signal transmission cables was measured at a frequency of 12.5 GHz, the results of which are shown in FIG. 10A. Also, a differential-to-common mode conversion quantity of each of the finished signal transmission cables was measured at a frequency of 5 GHz, the results of which are shown in FIG. 10B.

The cables subjected to the surface modification treatments J4A to J4C exhibited respective differential-to-common mode conversion quantities smaller than those of the cables subjected to the surface modification treatments J4D to J4F under the same condition in terms of the arithmetic average roughness Ra. The reason is assumed to be as follows: The surface modification treatments J4A to J4C each improved the wettability on the outer peripheral surface of the insulation layer, and caused a plating solution to spread over the entire outer peripheral surface of the insulation layer. Thus, the adhesion between the insulation layer and the shield layer was improved, resulting in a reduced gap at an interface between the insulation layer and the shield layer. Consequently, an intra-pair skew was reduced, and the differential-to-common mode conversion quantity was reduced.

5. Other Embodiments

Although an embodiment of the present disclosure has been described above, the present disclosure is not limited to the above-described embodiment but may be implemented in various modified forms.

(1) A function performed by a single element in the above-described embodiment may be achieved by a plurality of elements, or functions performed by a plurality of elements may be achieved by a single element. A part of a configuration in the above-described embodiment may be omitted. Also, at least a part of a configuration in the above-described embodiment may be added to, or may replace, a configuration in another embodiment. It is to be understood that any form included in the technical idea defined in the language of the appended claims may be an embodiment of the present disclosure.

(2) In addition to the above-described signal transmission cable, the present disclosure may be achieved in various forms, such as a system comprising the signal transmission cable as an element, a method for manufacturing the signal transmission cable, and a signal transmission method using the signal transmission cable.

What is claimed is:

1. A signal transmission cable comprising:
   a signal line;
   an insulation layer covering the signal line; and
   a shield layer covering the insulation layer,
   wherein a first oxygen amount $A_1$ measured on an outer peripheral surface of the insulation layer is 1.2 times or greater than a second oxygen amount $A_2$ measured inside the insulation layer at a position where a distance from the outer peripheral surface of the insulation layer is 10 μm,
   wherein a contact angle on the outer peripheral surface of the insulation layer is 106.1° or more and 111.0° or less,
   wherein an adhesion-wetting surface energy on the outer peripheral surface of the insulation layer is 47 mJ/m² or greater and 53 mJ/m² or less,
   wherein an arithmetic average roughness on the outer peripheral surface of the insulation layer is in a range from 1.0 to 1.3 μm, and
   wherein no blister is present on a surface of the shield layer.

2. The signal transmission cable according to claim 1, wherein a first amount of a hydroxy group on the outer peripheral surface of the insulation layer is greater than a second amount of a hydroxy group inside the insulation layer.

3. The signal transmission cable according to claim 1, wherein the insulation layer comprises polyethylene or perfluoro ethylene propene copolymer.

4. The signal transmission cable according to claim 1, wherein the shield layer comprises at least one selected from a group consisting of aluminum, aluminum alloy, copper, copper alloy, transition metal, and transition metal alloy.

5. The signal transmission cable according to claim 1, wherein the shield layer comprises a plating layer.

6. The signal transmission cable according to claim 1, wherein the shield layer comprises a plurality of stacked thin films, and
wherein at least a part of the plurality of thin films is selected from a group consisting of an aluminum thin film, an aluminum alloy thin film, a copper thin film, a copper alloy thin film, a transition metal thin film, and a transition metal alloy thin film.

7. The signal transmission cable according to claim 1, wherein the shield layer comprises an element exhibiting magnetism.

8. The signal transmission cable according to claim 1, wherein the shield layer comprises one or more selected from a group consisting of Fe, Co, Ni, and Gd.

9. The signal transmission cable according to claim 1, wherein the shield layer comprises a rare earth element.

10. The signal transmission cable according to claim 1, wherein the shield layer comprises one or more selected from a group consisting of Tb, Dy, Ho, Er, and Tm.

11. The signal transmission cable according to claim 1, wherein the shield layer comprises a precious metal element and/or a rare metal.

12. The signal transmission cable according to claim 1, wherein the shield layer comprises one or more selected from a group consisting of Au, Ag, Pt, Pd, Rh, Ir, Ru, and Os.

13. The signal transmission cable according to claim 1, wherein the shield layer comprises a carbon nanotube.

* * * * *